United States Patent
Ching et al.

(10) Patent No.: US 10,910,557 B2
(45) Date of Patent: Feb. 2, 2021

(54) APPARATUS AND METHODS OF FABRICATING A MAGNETO-RESISTIVE RANDOM ACCESS MEMORY (MRAM) DEVICE

(71) Applicant: APPLIED MATERIALS, INC., Santa Clara, CA (US)

(72) Inventors: Chi Ching, Santa Clara, CA (US); Renu Whig, Chandler, AZ (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/570,492

(22) Filed: Sep. 13, 2019

(65) Prior Publication Data

US 2020/0091420 A1    Mar. 19, 2020

Related U.S. Application Data

(60) Provisional application No. 62/731,383, filed on Sep. 14, 2018.

(51) Int. Cl.

| | |
|---|---|
| *H01L 43/12* | (2006.01) |
| *H01L 43/10* | (2006.01) |
| *H01L 43/02* | (2006.01) |
| *H01L 27/22* | (2006.01) |
| *H01F 41/32* | (2006.01) |
| *H01F 10/32* | (2006.01) |
| *G11C 11/16* | (2006.01) |

(52) U.S. Cl.
CPC ............ *H01L 43/12* (2013.01); *G11C 11/161* (2013.01); *H01F 10/329* (2013.01); *H01F 10/3259* (2013.01); *H01F 10/3272* (2013.01); *H01F 41/32* (2013.01); *H01L 27/222* (2013.01); *H01L 43/02* (2013.01); *H01L 43/10* (2013.01)

(58) Field of Classification Search
CPC ......... H01L 43/12; H01L 43/10; H01L 43/02; H01L 27/222; H01F 41/32; H01F 10/3272; H01F 10/3259; H01F 10/329; H01F 10/3236; H01F 10/30; H01F 41/307; G11C 11/161
USPC ........................................ 257/421
See application file for complete search history.

(56) References Cited

U.S. PATENT DOCUMENTS

| | | |
|---|---|---|
| 9,136,464 B1 | 9/2015 | Whig et al. |
| 9,159,906 B2 | 10/2015 | Whig et al. |
| 9,391,264 B2 | 7/2016 | Pietambaram et al. |
| 10,255,935 B2 | 4/2019 | Xue et al. |
| 10,468,592 B1* | 11/2019 | Xue ............... G11C 11/161 |
| 2010/0148167 A1 | 6/2010 | Whig et al. |
| 2016/0211440 A1* | 7/2016 | Siddik ............ H01L 43/08 |
| 2019/0131519 A1 | 5/2019 | Ikegawa et al. |
| 2019/0165253 A1 | 5/2019 | Sun et al. |

(Continued)

*Primary Examiner* — Caleen O Sullivan
(74) *Attorney, Agent, or Firm* — Moser Taboada

(57) ABSTRACT

Methods and apparatus for forming a magnetic tunnel element are provided herein. A method of forming a magnetic tunnel element includes: depositing a magnetic layer atop a cobalt-chromium seed layer; and depositing a tunnel layer atop the magnetic layer to form a magnetic tunnel element, wherein the magnetic tunnel element has a TMR greater than 100. For example, a cobalt/platinum material or one or more layers thereof may be deposited directly atop a cobalt-chromium seed layer to produce improved devices.

19 Claims, 5 Drawing Sheets

(56) References Cited

U.S. PATENT DOCUMENTS

2019/0348600 A1 11/2019 Xue et al.
2019/0363246 A1 11/2019 Xue et al.

* cited by examiner

APPARATUS AND METHODS OF FABRICATING A MAGNETO-RESISTIVE RANDOM ACCESS MEMORY (MRAM) DEVICE

CROSS-REFERENCE

This application claims benefit of U.S. Provisional Patent Application Ser. No. 62/731,383, filed Sep. 14, 2018 which is herein incorporated by reference in its entirety.

FIELD

Embodiments of the present disclosure generally relate to an apparatus and method for fabricating devices on semiconductor substrates. More specifically, the present disclosure relates to a method for fabricating a magneto-resistive random access memory (MRAM) device.

BACKGROUND

Microelectronic devices are generally fabricated on a semiconductor substrate as integrated circuits wherein various conductive layers are interconnected to one another to facilitate propagation of electronic signals within the device. An example of such a device is a storage element in memories such as magneto-resistive random access memories (MRAM) that facilitate storage of digital information.

A memory cell in a MRAM device is a multi-layered structure typically including two sets of magnetic layers separated by a non-magnetic dielectric material. These layers are deposited as overlying blanket films, and then patterned to form the MRAM device. Typically, the MRAM device may include a top electrode layer, a free magnetic layer, a tunnel layer, a magnetic stack such as synthetic antiferromagnets or a multilayered magnetic stack, a bottom electrode, and optionally a barrier layer.

Fabrication of an MRAM device may include an anneal process in which one or more layers of an MRAM film stack are annealed at over 350 degrees Celsius, either partially or in total. The inventors have observed the MRAM film stack such as a magnetic tunnel junction (MTJ) including materials such as thin magnesium oxide films or thin magnetic layer films have low thermal stability thus are sensitive to heat and may be easily warped or damaged during device fabrication or use thereof. For example, one or more magnesium oxide layers having low thermal stability in a tunnel layer of an MTJ element may lower the tunnel magnetoresistance (TMR) of the MTJ or cause electrical short-circuits within the MRAM film stack decreasing productivity and increasing the cost of fabricating the MRAM devices. Further, the inventors have observed that the MRAM film stack including materials such as thin magnetic layer films have low thermal stability thus are sensitive to heat and may be easily warped or damaged during device fabrication and use thereof. The thin magnetic layers within the device may degrade upon use at an elevated temperature.

Therefore, there is a need in the art for an improved methods of fabrication of a magneto-resistive random access memory (MRAM) device such as an MTJ element having a high TMR and a thermal stability that can withstand typical MRAM processing thermal budgets.

SUMMARY

Methods and apparatus for forming a magnetic tunnel element are provided herein. In some embodiments, a method of forming a magnetic tunnel element includes: depositing a magnetic layer atop a cobalt-chromium seed layer; and depositing a tunnel layer atop the magnetic layer to form a magnetic tunnel element, wherein the magnetic tunnel element has a TMR greater than 100. For example, in embodiments, a layer of cobalt platinum may be deposited atop a cobalt-chromium seed layer as described herein.

In some embodiments, a magnetic tunnel element is provided. In embodiments, the magnetic tunnel element includes a magnetic layer atop a cobalt-chromium seed layer; and a tunnel layer atop the magnetic layer to form a magnetic tunnel element, wherein the magnetic tunnel element has a TMR greater than 100. For example, in embodiments, a tunnel layer may be deposited atop one or more cobalt platinum layers, wherein the one or more cobalt platinum layers are deposited atop a cobalt-chromium seed layer as described herein.

In some embodiments, a computer readable medium, having instructions stored thereon is provided which, when executed, cause a method of forming a magnetic tunnel element comprising: depositing a magnetic layer atop a cobalt-chromium seed layer; and depositing a tunnel layer atop the magnetic layer to form a magnetic tunnel element, wherein the magnetic tunnel element has a TMR greater than 100.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
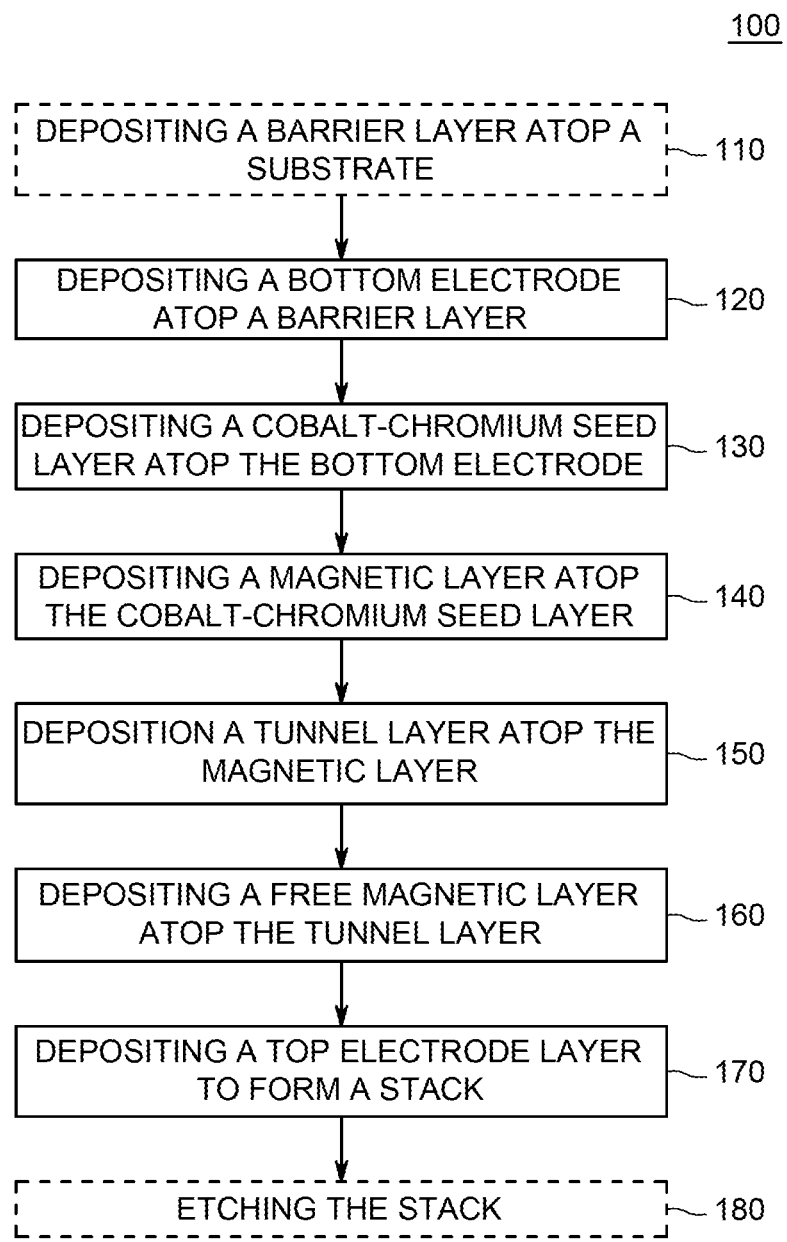
FIG. 1 is a flow diagram of a method of making an MRAM film stack in accordance with one embodiment of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method of forming a magneto-resistive random access memory (MRAM) device and structures thereof, include: depositing a tunnel layer atop a cobalt-chromium seed layer are provided herein. For example, in embodiments, depositing a cobalt-chromium seed layer in a film stack including a tunnel layer, such as an MTJ layer, enhances the TMR of the tunnel layer. The enhanced TMR values together with excellent thermal stability make cobalt-chromium alloys extremely attractive for MRAM applications as well as other applications. The cobalt-chromium seed layer provides an MTJ device in accordance with the present disclosure showing excellent thermal stability sufficient to withstand MRAM processing thermal budgets. Using a cobalt-chromium seed layer in accordance with the present disclosure, the layers are stable to temperatures that are greater than 300 degrees Celsius. In some embodiments, the tunnel layer is deposited directly atop a magnetic layer including one or more layers of cobalt/platinum (Co/Pt), iron/platinum (Fe/Pt), nickel/cobalt (Ni/Co), or combinations thereof, and the magnetic layer is directly atop and in contact with the cobalt-chromium seed layer. In embodiments the magnetic layer includes one or more cobalt/platinum (Co/Pt) thin films, deposited directly atop and in contact with a cobalt-chromium seed layer.

FIG. 1 is a flow diagram of one embodiment of a method of making an MRAM device in accordance with one embodiment of the present disclosure as sequence 100. The sequence 100 includes the processes that are performed upon a magneto-resistive random access memory (MRAM) film stack during fabrication of such MRAM device. FIGS. 2A-2I depict a series of schematic, cross-sectional views of a substrate including a MRAM device being formed using the sequence 100. The images in FIGS. 2A-2I are not depicted to scale and are simplified for illustrative purposes. The methods of the present disclosure may be performed in process chambers configured for atomic layer deposition (ALD), chemical vapor deposition (CVD), or physical vapor deposition (PVD) such as the process chamber discussed below with respect to FIG. 3.

Figure 2A:
FIGS. 2A-2I depict a series of schematic, cross-sectional views of a substrate having a MRAM film stack being formed in accordance with the method of FIG. 1.
Figure 2B:
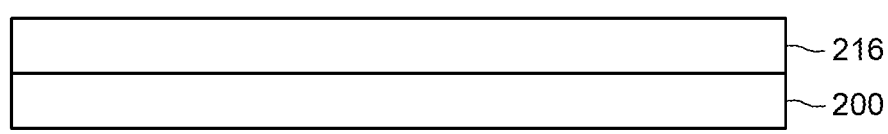

In some embodiments, the sequence 100 for forming am MRAM film stack 202 (FIG. 2I) on substrate 200 may start at 110 by optionally depositing a barrier layer 216 on a substrate 200 as shown in FIG. 2B. The substrate 200 may comprise a material such as crystalline silicon (e.g., Si<100> or Si<111>), silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, and combinations thereof. In embodiments, the substrate 200 may have various dimensions, such as 200 mm, 300 mm, 450 mm or other diameters for round substrates. The substrate 200 may also be any polygonal, square, rectangular, curved or otherwise non-circular workpiece, such as a polygonal glass substrate used in the fabrication of flat panel displays. Unless otherwise noted, implementations and examples described herein are conducted on substrates such as substrate 200 with a 200 mm diameter, a 300 mm diameter, or a 450 mm diameter substrate. In some embodiments, the barrier layer 216 is deposited via any suitable atomic layer deposition process or a chemical layer deposition process. Barrier layer is generally formed from a dielectric material (e.g., silicon dioxide ($SiO_2$), silicon nitride ($Si_3N_4$), and the like) to a thickness of about 100-500 angstroms.

Figure 2C:
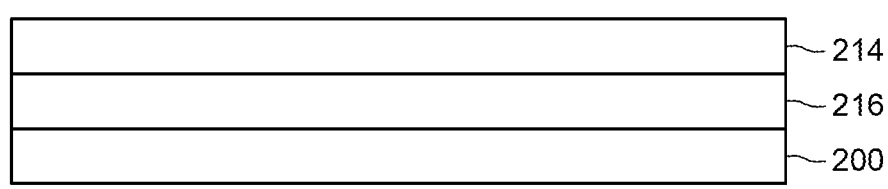

Referring to FIG. 1, at 120 and FIG. 2C, the MRAM film stack 202, in embodiments, comprises or is formed atop a bottom electrode 214 deposited upon barrier layer 216 or directly upon substrate 200. In embodiments, bottom electrode 214 may be formed of a conductive material (e.g., tantalum (Ta), tantalum nitride (TaN), copper (Cu), and the like) to a thickness of about 200-600 angstroms. In some embodiments, the bottom electrode 214 is deposited via any suitable atomic layer deposition process or a chemical layer deposition process.

Figure 2D:
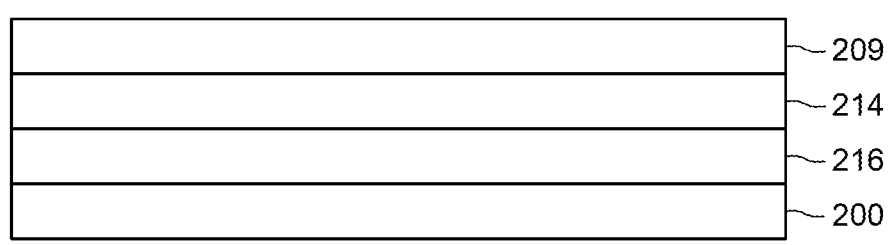
Figure 3:
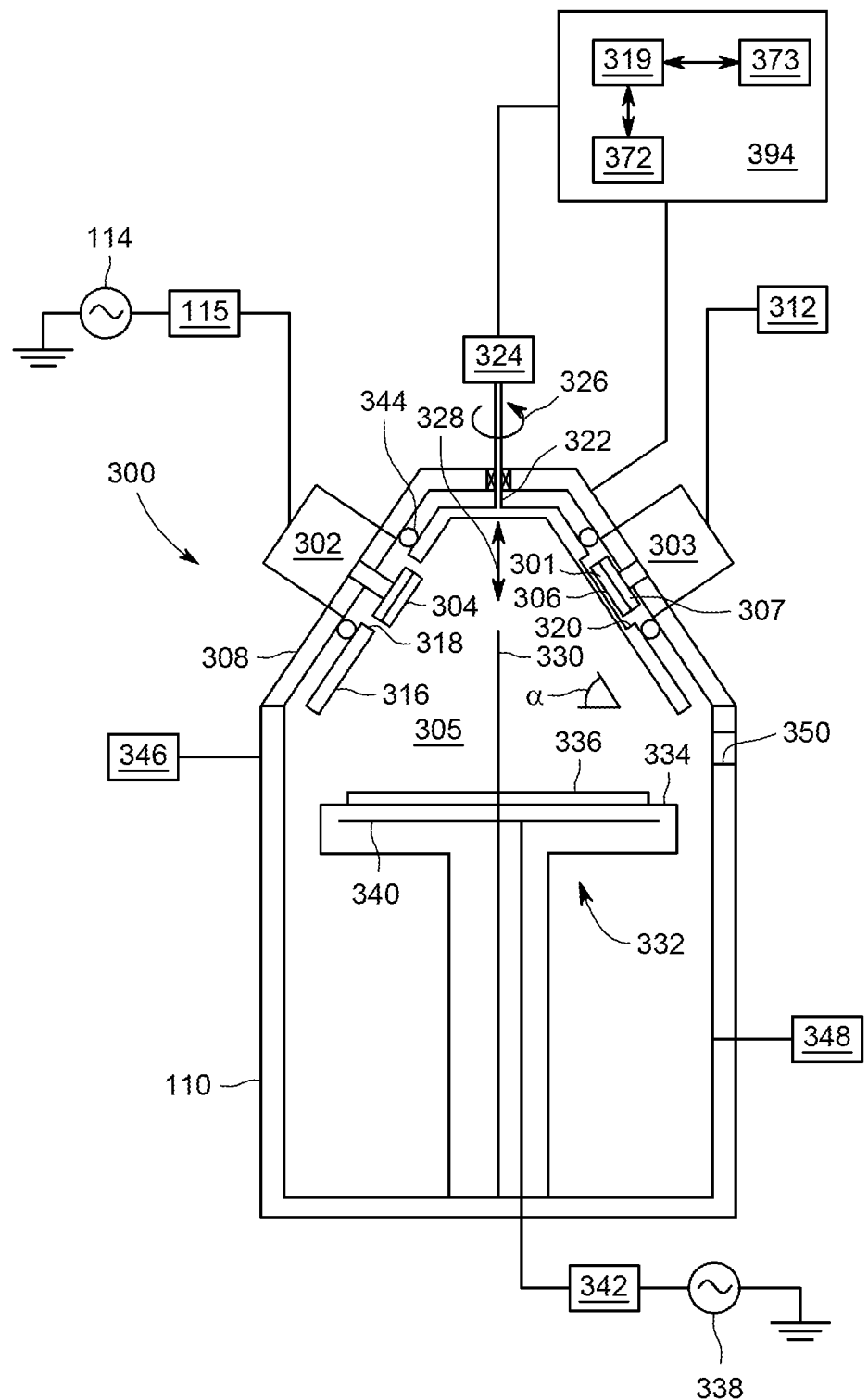
FIG. 3 depicts a process chamber suitable for depositing cobalt-chromium seed layers in accordance with the present disclosure.

Referring now to FIG. 1, at 130 and FIG. 2D, the MRAM film stack 202 comprises a cobalt-chromium seed layer 209 deposited upon the bottom electrode 214. In embodiments, the cobalt-chromium seed layer is an alloy of cobalt and chromium. In some embodiments, the cobalt-chromium is 40 to 80 atomic percent chromium, 50 to 70 atomic percent chromium, 55 to 65 atomic percent chromium, about 60 atomic percent chromium, or 60 atomic percent chromium. In some embodiments, the cobalt-chromium is 20 to 60 atomic percent cobalt, 30 to 50 atomic percent cobalt, 35 to 45 atomic percent cobalt, about 40 atomic percent cobalt, or 40 atomic percent cobalt. In some embodiments, the cobalt-chromium is a substantially pure cobalt-chromium alloy such as 99.999 percent free of impurities. In some embodiments, the cobalt-chromium seed layer 209 has a thickness of 20 to 1000 angstroms. In embodiments, the cobalt-chromium seed layer 209 is formed using a PVD co-sputtering process chamber to form a layer of cobalt-chromium sufficient to cover bottom electrode 214. Non-limiting examples of a process chamber suitable for depositing a cobalt-chromium seed layer 209 for use herein is shown in FIG. 3 and described further below. However, other methods for depositing cobalt-chromium seed layer 209 known in the art may be suitable for use herein.

Figure 2E:
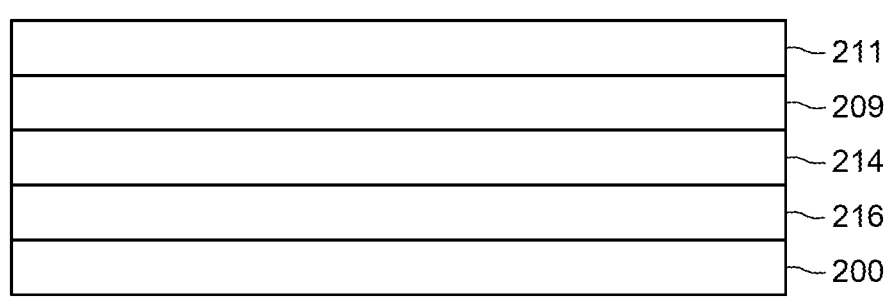

Referring now to FIG. 1, at 140 and FIG. 2E, the MRAM film stack 202, in embodiments, comprises a magnetic layer 211. In embodiments, magnetic layer 211 includes synthetic antiferromagnets (SAF) layer such as a Co/Pt layer atop a cobalt-chromium seed layer 209. In some embodiments, magnetic layer 211 includes one or more layers of material suitable for forming a multi-layered magnetic stack. In embodiments, the magnetic layer 211 includes on or more layers of Co—Pt thin films, such as layers 210 and 212 shown in phantom in FIG. 2F. In embodiments, magnetic layer 211 includes one or more layers of Co/Pt, Fe/Pt, Ni/Co, and combinations thereof. In one embodiment, magnetic layer 211 comprises a several (3 or more) layers of cobalt/platinum (Co/Pt alloy) deposited directly atop cobalt-chromium seed layer 209. In one embodiment, one or more layers of Co/Pt are deposited directly atop a cobalt-chromium seed layer 209 smoothing the surface of the one or more layers of Co/Pt. In embodiments, alloys of Co comprising platinum, copper, nickel and iron) are suitable for use as magnetic layer 211. In embodiments, magnetic layer 211 comprises one or more Co—Pt alloy films, wherein Co and Pt are present in an atomic ratio of 1:1, 2:1, 3:1, 4:1, and the like.

In embodiments, one or more Co/Pt layers as described herein grown upon or deposited directly atop cobalt-chromium seed layer 209 results in lower roughness of the magnetic layer or one or more Co/Pt layers and the ability to produce low RA devices with high thermostability (350-450 degrees C.) with greater than 100%, greater than 120%, greater than 150% TMR.

Figure 2F:
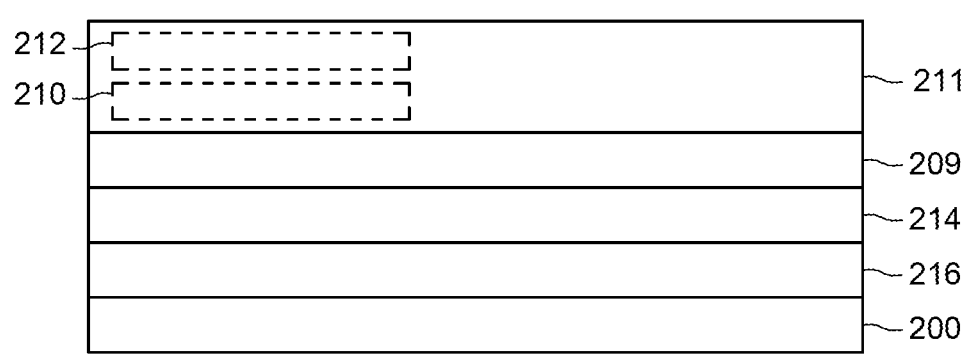

In embodiments, a multi-layer magnetic stack 220 includes a pinned layer such as layer 210 (shown in phantom) in FIG. 2F. The pinned layer may include at least one film of cobalt-iron (CoFe) alloy, CoFeB, ruthenium (Ru), nickel-iron-chromium (NiFeCr) alloy, nickel-iron (NiFe) alloy, and the like. In embodiments, the pinned layer such as layer 210 of the multi-layer magnetic stack 220 is below the pinning layer such as layer 212 to a thickness of about 8-200 angstroms. In embodiments, a multi-layer magnetic stack includes a pinning layer such as layer 212 (shown in phantom) in FIG. 2F. In embodiments, the pinning layer such as a layer 212 may include at least one film of platinum-manganese (PtMn) alloy, iridium-manganese (IrMn) alloy, and the like. In embodiments, the pinning layer such as layer 212 of the multi-layer magnetic stack 220 are deposited upon the bottom electrode 214 to a thickness of about 8-200 angstroms. In some embodiments, the pinned layer such as layer 210 and pinning layer such as layer 212 are deposited via any suitable atomic layer deposition process or a chemical layer deposition process.

Figure 2G:
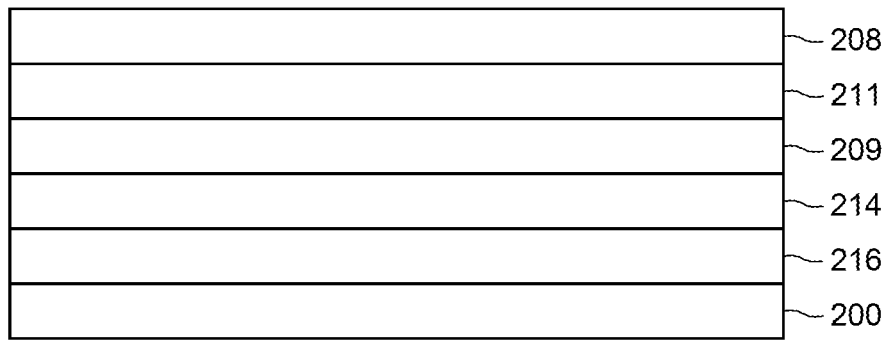

Referring now to FIG. 1, at 150 and FIG. 2G, the MRAM film stack 202 includes a tunnel layer 208 deposited atop magnetic layer 211. In some embodiments, the tunnel layer 208 includes a magnetic tunnel junction (MTJ) of an MRAM device and is composed of a non-magnetic dielectric material, such as alumina ($Al_2O_3$) or magnesium oxide (MgO). In embodiments, the tunnel layer 208 has a thickness of about 10-20 angstroms. In some embodiments, the tunnel layer 208 is deposited via any suitable atomic layer deposition process or a chemical layer deposition process.

In some embodiments, the MRAM film stack 202 may be annealed by heating the MRAM film stack 202 to a temperature of greater than 350 degrees Celsius, greater than 400 degrees Celsius for a duration of 30 minutes to 5 hours. However, the anneal process may be performed at suitable fabrication time such that one or more layers of an MRAM film stack are annealed at over 350 degrees Celsius, either partially or in total.

Figure 2H:
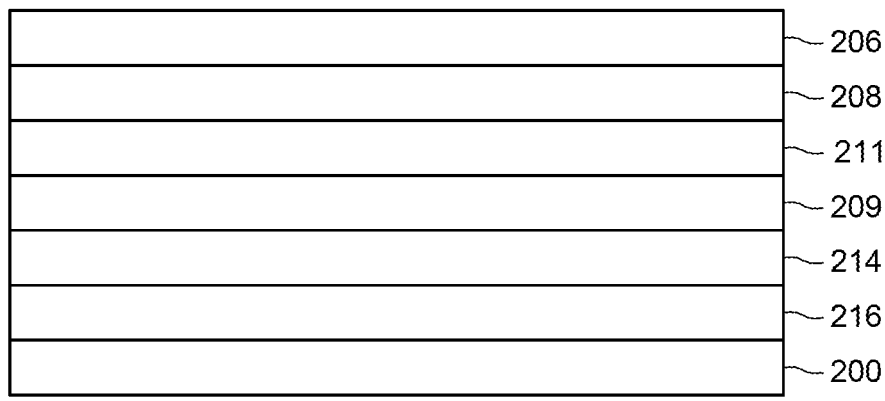

Referring now to FIG. 1, at 160 and FIG. 2H, the MRAM film stack 202 may in some embodiments includes a free magnetic layer 206 deposited atop a tunnel layer 208. The free magnetic layer 206 may include one or more films of nickel-iron (NiFe) alloy, cobalt-iron (CoFe) alloy, cobalt/iron/boron, and the like to a thickness of about 20-200 angstroms. In some embodiments, the free magnetic layer 206 is deposited via any suitable atomic layer deposition process or a chemical layer deposition process.

Figure 2I:

Referring now to FIG. 1, at 170 and FIG. 2I, the multi-layer magnetic stack 220 may in some embodiments includes a top electrode layer 204 deposited atop free magnetic layer 206. The top electrode layer 204 and the bottom electrode 214 are generally each formed of a conductive material (e.g., tantalum (Ta), tantalum nitride (TaN), copper (Cu), and the like) to a thickness of about 200-600 angstroms. In some embodiments, the top electrode layer 204 is deposited via any suitable atomic layer deposition process or a chemical layer deposition process.

As shown in FIG. 2I, the MRAM film stack 202 comprises a cobalt-chromium seed layer 209 disposed upon bottom electrode 214. A magnetic layer 211 suitable for an MRAM device is disposed upon the cobalt-chromium seed layer 209. A tunnel layer 208 is disposed upon the magnetic layer 211. In some embodiments tunnel layer 208 includes or consists of MgO, and is disposed upon synthetic antiferromagnets (SAF) layer such as a Co/Pt layer forming the magnetic layer 211. In some embodiments tunnel layer 208 includes or consists of MgO, and is disposed upon synthetic antiferromagnets (SAF) layer such as a Co/Pt layer forming the magnetic layer 211, wherein the magnetic layer is in contact with cobalt-chromium seed layer 209.

In embodiments, the layers of the MRAM film stack 202 can be formed using any conventional thin film deposition technique, such as atomic layer deposition (ALD), physical vapor deposition (PVD), chemical vapor deposition (CVD), plasma enhanced CVD (PECVD), and the like. Fabrication of the MRAM devices may be performed using the respective processing reactors of CENTURA®, ENDURA® and other semiconductor wafer processing systems available from Applied Materials, Inc. of Santa Clara, Calif.

In embodiments, MRAM film stack 202 may be subject to further processing such as etching the film stack to form a device with desired dimensions. Non-limiting examples of etching techniques suitable for use herein are described in U.S. Pat. No. 6,841,484 entitled Method of Fabricating a Magneto-Resistive Random Access Memory (MRAM) Device to Ying et al. Additional capping layers may be added to the MRAM film stack as desired. In embodiments, a plurality of metal layers may be deposited atop the tunnel layer.

In embodiments, an MRAM device may be formed having a TMR greater than 80, greater than 90, greater than 100, greater than 110, greater than 120, greater than 130, greater than 140, or greater than 150, or a TMR in the amount of 70 to 155. In some embodiments, the MTJ stack of the MRAM device has an RA between 1-20 $\Omega$-$um^2$, 1-10 $\Omega$-$um^2$, 1-5 $\Omega$-$um^2$, 2-4 $\Omega$-$um^2$, such as about 3 $\Omega$-$um^2$, or 3 $\Omega$-$um^2$.

FIG. 3 depicts a simplified, cross-sectional view of a physical vapor deposition (PVD) processing system such as process chamber 300 suitable for depositing layers, such as the cobalt-chromium seed layer in accordance with some embodiments of the present disclosure. Examples of other PVD chambers suitable for performing the sequence 100 described herein include the CIRRUS™ and AVENIR® PVD processing chambers, both commercially available from Applied Materials, Inc., of Santa Clara, Calif. In embodiments, the PVD chamber may include a magnetron.

In some embodiments, a PVD chamber such as, for example, a multi-cathode PVD chamber (e.g., process chamber 300) includes a plurality of cathodes 302, 303 having a corresponding plurality of targets made of preselected material suitable for depositing a desired layer. For example, process chamber 300 may include at least one dielectric target assembly such as target assembly 304 and at least one metallic target assembly such as target assembly 306), attached to the chamber body (for example, via a chamber body adapter 308). In one embodiment, suitable for depositing a cobalt-chromium seed layer, target assembly 304 may be cobalt, and target assembly 306 may be chromium. In one embodiments suitable for depositing an MgO layer, target assembly 304 may be magnesium. The processing chamber includes a substrate support 332 having a support surface 334 to support a work piece 336. The process chamber 300 includes an opening 350 (e.g., a slit valve) through which an end effector (not shown) may extend to place a work piece 336 onto lift pins (not shown) for lowering the substrate onto a support surface 334.

In the embodiment shown in FIG. 3, each target is disposed at a predetermined angle $\alpha$ with respect to the support surface 334. In some embodiments, the angle $\alpha$ may be between about 10° to about 50°. The substrate support includes an RF bias power source 338 coupled to a bias electrode 340 disposed in the substrate support 332 via a matching network 342. The chamber body adapter 308 is coupled to an upper portion of a chamber body 310 of the process chamber 300 and is grounded. Each cathode can have a DC power source such as a secondary energy source 312 or an RF power source 314 and an associated magnetron. The dual power sources permits both DC powered processes and RF powered processes to occur in the same process chamber such as process chamber 300. In the case of the RF power source 314, the RF power source 314 is coupled to the cathode 302 via an RF matching network 315. The RF energy supplied by the RF power source 314 may range in frequency from about 13.56 MHz and to about 162 MHz or above. For example, non-limiting frequencies such as 13.56 MHz, 27.12 MHz, 60 MHz, or 162 MHz can be used.

The RF bias power source 338 may be coupled to the substrate support 332 in order to induce a negative DC bias on the work piece 336. In addition, in some embodiments, a negative DC self-bias may form on the work piece 336 during processing. For example, RF energy supplied by the RF bias power source 338 may range in frequency from about 2 MHz to about 60 MHz, for example, non-limiting frequencies such as 2 MHz, 13.56 MHz, or 60 MHz can be used. In other applications, the substrate support 332 may be grounded or left electrically floating.

A shield 316 is rotatably coupled to the chamber body adapter 308 and is shared by all the cathodes. Depending on the number of targets that need to be sputtered at the same time, the rotating shield 316 can have one or more holes to expose a corresponding one or more targets. The shield 316 limits or eliminates cross-contamination between the plurality of targets such as target assembly 304,306. For example, in some embodiments where five cathodes are provided, the shield 316 may include at least one hole 318 to expose a target assembly 304 to be sputtered and at least one pocket 320 to house a target (e.g., metallic target such as target assembly 306) that is not being sputtered. The shield 316 is rotationally coupled to the chamber body adapter 308 via a shaft 322. In some embodiments, the shield 316 has one or more sidewalls configured to surround a processing volume within the inner or interior volume such as processing region 305.

An actuator 324 is coupled to the shaft 322 opposite the shield 316. An actuator 324 is configured to rotate the shield 316, as indicated by arrow 326, and move the shield 316 up and down along a central axis 330 of the process chamber 300, as indicated by arrow 328. When the shield 316 is moved up into a retracted position so that a face of the shield surrounding the hole 318 is behind a face of the target (e.g., dielectric target or target assembly 304) facing the work piece 336, materials sputtered in a dark space surrounding the target (e.g., on a sidewall of the hole 318) are minimized. As a result, materials sputtered from one target (e.g. dielectric target such as target assembly 304) do not contaminate another target (e.g., metallic target e.g., target assembly 306) due to sputtering of material that has accumulated in the dark space.

The process chamber 300 also uses the shield 316 to surround the interior volume such as processing region 305 of the process chamber 300 and to protect other chamber components besides the targets such as target assembly 304, 306 from damage and/or contamination from processing. During processing, source material from a target assembly 304, 306 is sputtered onto the work piece 336. The sputtering process forms a thin deposition layer or film of the source material on the surface of the work piece 336. The sputtering process, however, not only deposits source material on the work piece 336, but also on the shield 316 and other surfaces of the interior volume such as processing region 305. The extra deposits are unwanted coatings or depositions on surfaces other than the work piece 336 and may generate particles that can break away from the interior surfaces and fall onto the work piece 336. These particles may cause defects in the deposition layer or film on the surface of the work piece 336. Particle generation is a significant and long standing problem for substrate processing.

The process chamber 300 may include a plurality of RF grounding rings 344 to provide improved grounding of the shield 316 to the grounded chamber body adapter 308 when the shield is in the retracted position. The RF grounding rings 344 advantageously prevent the shield 316 from getting negatively charged by minimizing the energy between the plasma and the shield.

The process chamber 300 may further include a process gas supply 346 to supply a predetermined process gas to an interior volume such as processing region 305 of the process chamber 300. For example, the process gas supply 346 may supply oxygen to the interior volume such as processing region 305 after the metallic target such as target assembly 306 has been sputtered as discussed in more detail below. The process chamber 300 may also include an exhaust pump 348 fluidly coupled to the interior volume such as processing region 305 to exhaust the process gas and to facilitate in maintaining a desired pressure inside the process chamber 300. Pressure level adjustment is used in some embodiments of the present principles and is discussed in more detail below.

In some embodiments, the process chamber 300 can be used in the processing of many new memory products such as, for example, spin-transfer torque magnetic random access memory (STT-MRAM). STT-MRAM have a layered deposition stack that is dependent on a critical tunneling barrier layer. A typical dielectric material used for the barrier layer is magnesium oxide (MgO). The MgO barrier layer can be deposited, for example, by using DC power as $Mg+O^2$ (oxygen is flowed into the chamber while the Mg is being deposited on a wafer) or using RF power as MgO (an MgO sputtering target is used for wafer deposition). However, DC power does not operate efficiently with dielectric films due to the buildup of dielectric material on the interior surfaces of the process chamber. AC powered processes, such as RF powered processes, work better with dielectric materials. The cobalt-chromium seed layer may be deposited under similar conditions, however process gas such as process gas including argon, krypton and the like may be flowed into a chamber. In one embodiments, the cobalt-chromium seed layer may be formed by co-sputtering, however, other deposition methods known in the art may be suitable for use herein.

A controller 394 may be provided and coupled to various components of the PVD processing system such as process chamber 300 to control the operation of the system. The controller 394 includes a central processing unit (CPU) 319, a memory 372, and support circuits 373. The controller 394 may control the PVD processing system such as process chamber 300 directly, or via computers (or controllers) associated with particular process chamber and/or support system components. The controller 394 may be one of any form of general-purpose computer processor that can be used in an industrial setting for controlling various chambers and sub-processors. The memory, or computer readable medium, 372 of the controller 394 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 373 are coupled to the CPU 319 for supporting the processor in a conventional manner. These circuits include cache, power supplies, clock circuits, input/output circuitry and subsystems, and the like. Inventive methods as described herein may be stored in the memory 372 as software routine that may be executed or invoked to control the operation of the PVD processing system such as process chamber 300 in the manner described herein. The software routine may also be stored and/or executed by a second CPU (not shown) that is remotely located from the hardware being controlled by the CPU 319.

Figure 4:
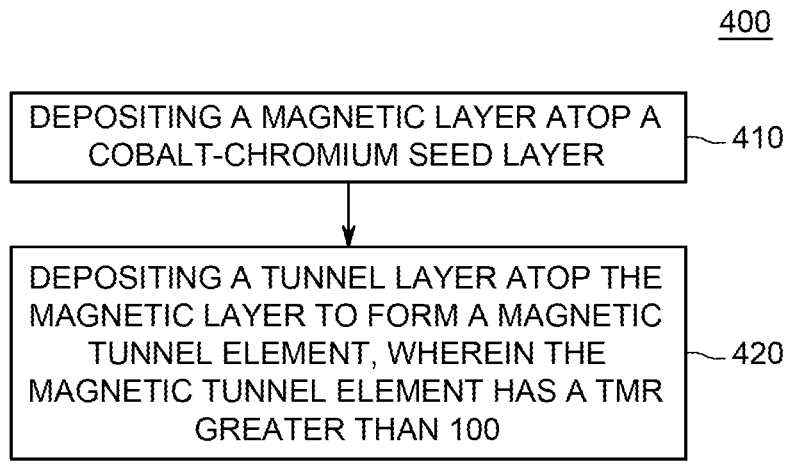
FIG. 4 is a flow diagram of a method of making a magnetic tunnel element of the present disclosure.
Figure 5A:
FIGS. 5A-5B depict a series of schematic, cross-sectional views of a magnetic tunnel element in accordance with the present disclosure.
Figure 5B:
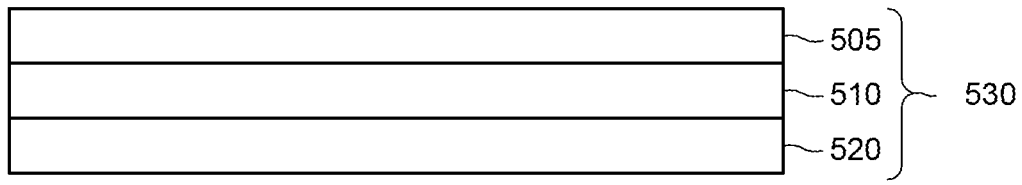

FIG. 4 is a flow diagram of one embodiment of a method of making a magnetic tunnel element in accordance with one embodiment of the present disclosure as sequence 400. The sequence 400 includes the processes that are performed upon a magnetic tunnel element during fabrication of an MRAM device. FIGS. 5A-5C depict a series of schematic, cross-sectional views of a substrate including a magnetic tunnel element being formed using the sequence 400.

Sequence 400 relates to a method of forming a magnetic tunnel element. Sequence 400 starts at 410 by depositing a magnetic layer atop a cobalt-chromium seed layer. The magnetic layer 510, and cobalt-chromium seed layer 520 may include the same materials and be deposited in the same manner as described above. In one embodiment, the cobalt-chromium seed layer 520 is deposited by co-sputtering target material from process chamber 300 as described above. As shown in FIG. 5B, in embodiments, tunnel layer 505 is deposited atop the magnetic layer 510 to form a magnetic tunnel element 530, wherein the magnetic tunnel element 530 has a TMR greater than 100, greater than 120 or greater than 150. In some embodiments, the magnetic tunnel element 530 includes a cobalt-chromium seed layer 520 having a thickness of 20 to 1000 angstroms. In some embodiments, the cobalt-chromium seed layer 520 is 20 to 60 atomic percent cobalt. In some embodiments, the atomic percent cobalt is approximately 40, and the atomic percent chromium is approximately 60. In some embodiments, the cobalt-chromium seed layer is 40 to 80 atomic percent chromium. In some embodiments, the magnetic tunnel element 530 is thermal stable above 350 degrees Celsius such that the magnetic tunnel element has an RA between 1 to 202-4 $\Omega\text{-um}^2$ or 2-4 $\Omega\text{-um}^2$ after anneal thereof. In embodiments, the magnetic layer 510 comprises one or more layers of Co—Pt thin films. In embodiments, magnetic layer 510 comprises one or more layers of Co/Pt, Fe/Pt, Ni/Co, and combinations thereof. In one embodiment, magnetic layer 510 comprises a several (3 or more) layers of cobalt/platinum (Co/Pt alloy) deposited directly atop cobalt-chromium seed layer 520. In one embodiment, one or more layers of Co/Pt are deposited directly atop a cobalt-chromium seed layer 520 smoothing the surface of the one or more layers of Co/Pt. In embodiments, alloys of Co including platinum, copper, nickel and iron) are suitable for use as magnetic layer 510. In embodiments, magnetic layer 510 includes one or more Co—Pt alloy films, wherein Co and Pt are present in an atomic ratio of 1:1, 2:1, 3:1, 4:1, and the like.

Figure 6:
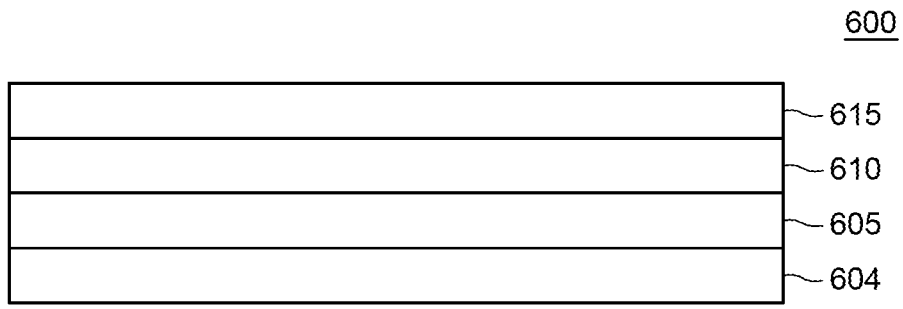
FIG. 6 shows a schematic diagram of a portion of a film stack, according to some embodiments of the present disclosure.

Referring now to FIG. 6, in some embodiments, a cobalt-chromium seed layer as described above may be incorporated into other structures and methods for fabricating magnetic tunnel junction (MTJ) structures on a substrate in MRAM applications, such as spin-transfer-torque magnetic random access memory (STT-MRAM) applications. FIG. 6 shows a schematic diagram of a portion of a film stack 600, according to some embodiments of the present disclosure. In some embodiments, methods and film stacks such as those described in U.S. Pat. No. 10,255,935 entitled Magnetic Tunnel Junctions Suitable For High Temperature Thermal Processing to Xue et al. and assigned to Applied Materials, Inc. may include a cobalt-chromium seed layer 610 as described herein. In some embodiments, a film stack utilized to form a magnetic tunnel junction (MTJ) structure on a substrate is provided. The film stack includes a buffer layer 605 and a seed layer 610 disposed directly atop the buffer layer 605. In some embodiments, the buffer layer 605 is disposed over a bottom contact 604. In some embodiments, the buffer layer 605 may be sandwiched between bottom contact 604 and seed layer 610. In embodiments, buffer layer 605 is suitable for improving adhesion and seeding of subsequently deposited layers. In some embodiments, buffer layer 605 includes one or more layers. In some embodiments, buffer layer 605 is not fabricated from ruthenium (Ru). In some embodiments, buffer layer 605 include or consist of CoFeB or TaNx, wherein x is a number or an integer. In some embodiments, methods of the present disclosure include forming a magnetic tunnel element by: depositing a magnetic layer atop, or directly atop a cobalt-chromium seed layer. In embodiments, the seed layer may be disposed atop or directly atop one or more buffer layers including or consisting of CoFeB or TaNx, or a combination thereof.

In some embodiments, buffer layer 605 includes a CoFeB containing layer. In some embodiments, the weight percentage of boron (B) in the buffer layer 605 is between about 10 weight % (wt %) and about 40 wt %, about 20 wt % to about 40 wt %, or about 25 wt % to about 40 wt %. In some embodiments, iron (Fe) is present in the buffer layer 605 in an amount of about 20 wt % to about 60 wt %, about 40 wt % to about 60 wt %, or about 45 wt % to about 60 wt %. In some embodiments, the thickness of a CoFeB containing buffer layer such as buffer layer 605 is between about 1 angstrom to 20 angstrom, or about 10 angstrom.

In some embodiments, the buffer layer 605 includes TaN containing layer and/or a Tantalum (Ta) containing layer. In embodiments, a TaN containing layer, and/or a TaN containing layer and Ta containing layer may be disposed under a CoFeB layer. In some embodiments, the thickness of the TaN containing layer and the Ta containing layer is between about 1 angstrom to 40 angstrom, or about 15 angstrom.

As shown in FIG. 6, a portion of film stack 600 includes a seed layer 610 disposed directly atop the buffer layer 605. The seed layer 610 may be sandwiched between the buffer layer 605 and a pinning layer 615.

In embodiments, other layers may be deposited atop seed layer 610 and pinning layer 615. For example, although not shown in FIG. 6, a magnetic layer, or other layers may be deposited atop the seed layer 610 and pinning layer 615. For example a synthetic ferrimagnet (SyF) coupling layer may be disposed over the first pinning layer; a second pinning layer may be disposed over the SyF coupling layer; a structure blocking layer may be disposed over the second pinning layer; a magnetic reference layer may be disposed over the structure blocking layer; a tunnel barrier layer may be disposed over the magnetic reference layer; a magnetic storage layer may be disposed over the tunnel barrier layer; a capping layer may be disposed over the magnetic storage layer. In some embodiments, the capping layer includes one or more layers. In some embodiments, a hard mask may be disposed over the capping layer. In some embodiments, at least one of the capping layer, the buffer layer, and the SyF coupling layer is not fabricated from Ru. In some embodiments, the layers are shown and described in U.S. Pat. No. 10,255,935 entitled Magnetic Tunnel Junctions Suitable For High Temperature Thermal Processing to Xue et al. and assigned to Applied Materials, Inc.

In some embodiments, the present disclosure relates to a computer readable medium, having instructions stored thereon which, when executed, cause a method of forming a magnetic tunnel element including: depositing a magnetic layer atop a cobalt-chromium seed layer; and depositing a tunnel layer atop the magnetic layer to form a magnetic tunnel element, wherein the magnetic tunnel element has a TMR greater than 100.

In some embodiments, the present disclosure relates to a magnetic tunnel element including: a magnetic layer atop a cobalt-chromium seed layer; and a tunnel layer atop the magnetic layer to form a magnetic tunnel element, wherein the magnetic tunnel element has a TMR greater than 100. In some embodiments the magnetic layer is directly atop the cobalt-chromium seed layer. In some embodiments, additional layers are between the magnetic layer and the cobalt-chromium seed layer. In some embodiments, the cobalt-chromium seed layer has a thickness of 20 to 1000 angstroms. In some embodiments, the cobalt-chromium seed layer is 20 to 60 atomic percent cobalt, or cobalt at about 40 atomic percent and chromium at about 60 atomic percent. In some embodiments, the cobalt-chromium seed layer is directly atop a buffer layer. In some embodiments, the cobalt-chromium seed layer is 40 to 80 atomic percent chromium. In some embodiments, the magnetic tunnel element has an RA between 1-20 $\Omega$-um$^2$, or 2-4 $\Omega$-um$^2$.

In some embodiments, the present disclosure relates to an apparatus configured for forming a magnetic tunnel element. In some embodiments, an apparatus is configured for forming a magnetic tunnel element including: depositing a magnetic layer atop a cobalt-chromium seed layer; and depositing a tunnel layer atop the magnetic layer to form a magnetic tunnel element, wherein the magnetic tunnel element has a TMR greater than 100. For example, in embodiments, a layer of cobalt platinum may be deposited atop a cobalt-chromium seed layer as described herein. In some embodiments, an apparatus is configured for forming a magnetic tunnel element including: depositing a magnetic layer directly atop a cobalt-chromium seed layer; and depositing a tunnel layer directly atop the magnetic layer to form a magnetic tunnel element, wherein the magnetic tunnel element has a TMR greater than 100.

In embodiments, the magnetic tunnel element includes a magnetic layer directly atop a cobalt-chromium seed layer; and a tunnel layer directly atop the magnetic layer to form a magnetic tunnel element, wherein the magnetic tunnel element has a TMR greater than 100. For example, in embodiments, a tunnel layer may be deposited directly atop one or more cobalt platinum layers, wherein the one or more cobalt platinum layers are deposited directly atop a cobalt-chromium seed layer as described herein.

While the foregoing is directed to embodiments of the present disclosure, other and further embodiments of the disclosure may be devised without departing from the basic scope thereof.

The invention claimed is:

1. A method of forming a magnetic tunnel element comprising:
    depositing a magnetic layer atop a cobalt-chromium seed layer; and
    depositing a tunnel layer atop the magnetic layer to form a magnetic tunnel element, wherein the magnetic tunnel element has a TMR greater than 100,
    wherein the cobalt-chromium seed layer is 20 to 60 atomic percent cobalt.

2. The method of claim 1, wherein the cobalt-chromium seed layer has a thickness of 20 to 1000 angstroms.

3. The method of claim 1, wherein an atomic percent cobalt is 35 to 45.

4. The method of claim 1, wherein an atomic percent cobalt is approximately 40.

5. The method of claim 1, wherein the cobalt-chromium seed layer is 40 to 80 atomic percent chromium.

6. The method of claim 5, wherein an atomic percent chromium is 55 to 65.

7. The method of claim 5, wherein an atomic percent chromium is approximately 60.

8. The method of claim 1, further comprising annealing at a temperature of from about 250 degrees Celsius to about 450 degrees Celsius.

9. The method of claim 1, wherein the cobalt-chromium seed layer is atop a bottom electrode or buffer layer.

10. The method of claim 1, further comprising depositing a plurality of metal layers atop the tunnel layer.

11. The method of claim 1, wherein the magnetic tunnel element has an RA between 1-20 $\Omega$-um$^2$, or between 2-4 $\Omega$-um$^2$.

12. The method of claim 1, wherein the magnetic layer comprises or consists of one or more synthetic antiferromagnets, one or more layers of Co/Pt, or one or more layers of Co/Pt, Fe/Pt, Ni/Co, and combinations thereof.

13. The method of claim 1, wherein the magnetic layer is a multi-layered structure comprising a pinned layer and a pinning layer.

14. A magnetic tunnel element comprising:
    a magnetic layer atop a cobalt-chromium seed layer; and
    a tunnel layer atop the magnetic layer to form a magnetic tunnel element, wherein the magnetic tunnel element has a TMR greater than 100,
    wherein the cobalt-chromium seed layer is 20 to 60 atomic percent cobalt.

15. The magnetic tunnel element of claim 14, wherein the cobalt-chromium seed layer has a thickness of 20 to 1000 angstroms.

16. The magnetic tunnel element of claim 14, wherein the cobalt-chromium seed layer is 20 to 60 atomic percent cobalt, or cobalt at about 40 atomic percent and chromium at about 60 atomic percent.

17. The magnetic tunnel element of claim 14, wherein the cobalt-chromium seed layer is directly atop a buffer layer.

18. The magnetic tunnel element of claim 14, wherein the magnetic tunnel element has an RA between 1-20 $\Omega$-um$^2$, or 2-4 $\Omega$-um$^2$.

19. A computer readable medium, having instructions stored thereon which, when executed, cause a method of forming a magnetic tunnel element comprising: depositing a magnetic layer atop a cobalt-chromium seed layer; and depositing a tunnel layer atop the magnetic layer to form a magnetic tunnel element, wherein the magnetic tunnel element has a TMR greater than 100, and wherein the cobalt-chromium seed layer is 20 to 60 atomic percent cobalt.

* * * * *